United States Patent [19]

Winterling et al.

[11] 4,369,205

[45] Jan. 18, 1983

[54] METHOD FOR MANUFACTURING SEMICONDUCTOR ELEMENTS FROM AMORPHOUS SILICON

[75] Inventors: Gerhard Winterling, Ottobrunn; Max Königer, Pullach, both of Fed. Rep. of Germany

[73] Assignee: Messerschmitt-Bölkow-Blohm Gesellschaft mit beschränkter Haftung, Fed. Rep. of Germany

[21] Appl. No.: 195,751

[22] Filed: Oct. 10, 1980

[30] Foreign Application Priority Data

Oct. 13, 1979 [DE] Fed. Rep. of Germany ....... 2941559

[51] Int. Cl.³ .............................................. B05D 3/06
[52] U.S. Cl. ..................................... 427/39; 118/623; 136/258; 204/181 N; 204/DIG. 5; 427/47; 427/87; 427/93
[58] Field of Search ..................... 427/39, 82, 84, 87, 427/47, 93; 118/715, 623, 624, 634; 136/258; 204/DIG. 5, 181 N, 192 S

[56] References Cited

U.S. PATENT DOCUMENTS 3,485,666 12/1969 Sterling et al. ..................... 427/39
4,022,947 5/1977 Grubb et al. ..................... 427/38 X
4,196,438 4/1980 Carlson ............................... 427/39

FOREIGN PATENT DOCUMENTS 1544612 4/1979 United Kingdom ............... 118/623

Primary Examiner—Thurman K. Page
Attorney, Agent, or Firm—McGlew and Tuttle

[57] ABSTRACT

A method and device for manufacturing semiconductor elements of amorphous silicon which convert light into electrical energy comprising, supplying a silicon compound to a vessel, passing an electric field through the vessel sufficient to produce a glow discharge having free electrons in the vessel to precipitate amorphous silicon from the silicon compound onto a substrate in the vessel, and providing a magnetic field in the vessel which is directed substantially transversely to the electric field and is of a magnitude sufficient to conduct the free electrons along closed paths over the surface of the substrate.

4 Claims, 3 Drawing Figures

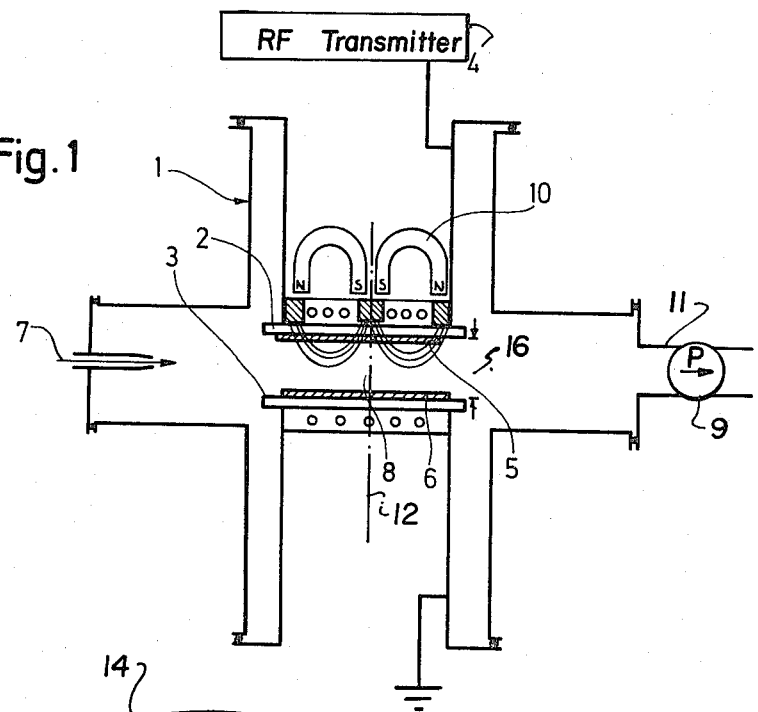
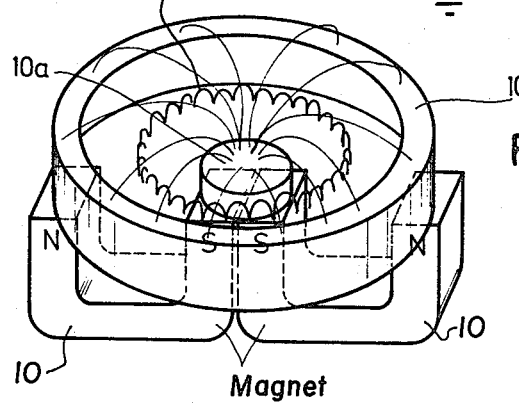
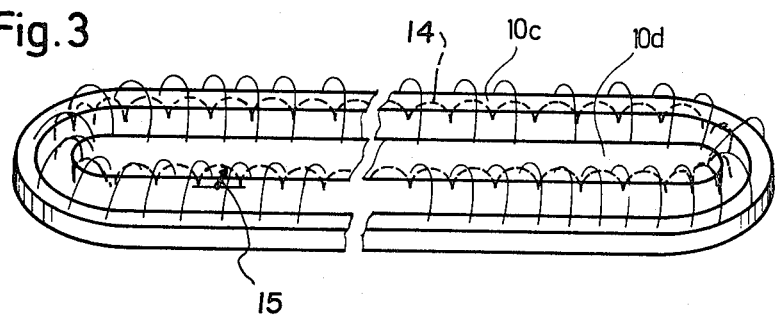

METHOD FOR MANUFACTURING SEMICONDUCTOR ELEMENTS FROM AMORPHOUS SILICON

FIELD AND BACKGROUND OF THE INVENTION

The present invention relates to a new and useful method of manufacturing semiconductor elements from amorphous silicon (a-Si) which convert light into electric energy, and a device for carrying out the method.

Amorphous silicon (a-Si) is a promising new and substantially less expensive material for the mentioned purpose than crystalline silicon. The value of a-Si is primarily in that because of its substantially higher optical absorption, it is needed in only about one micron thick layers, while with crystalline silicon, a thickness of at least 50 to 100 microns is necessary. Amorphous silicon can be deposited directly from a gaseous phase and on relatively inexpensive substrates and, in contradistinction to crystalline silicon, no further costly material processing is needed.

It is known, from German OS No. 27 43 141, to employ a glow discharge for producing a-Si semiconductor elements, for example, from silane. For this purpose, a glass bell jar is used, with a connected electrode and an opposite heating plate accommodated therein. One outlet of this jar communicates with a diffusion pump, another with a mechanical pump, and a third outlet is connected to a gas supply system serving as a source of the gases needed for the glow discharge. The substrate, for example, stainless steel, on which the a-Si is precipitated is placed on the heating plate. A source of energy which is usually radio-frequency operated is connected to the electrode and the substrate.

With such semiconductor elements, efficiencies of a few percent have been obtained up to the present time. To make them economically interesting, a substantially improved efficiency of the cells is needed. It is known that among other things, incorporation of hydrogen is of great importance for the electrical properties of a-Si (see also W. Spear et al. Solid State Comm. 17,1193,1975). Hydrogen serves to saturate the so called dangling bonds and reduces the number of traps in the mobility gap. The number of these traps is directly responsible for the range of the field zone extending in the a-Si cell from the pn-junction or the Schottky contact. A small number of traps means that a wide field zone can be obtained. Since in an a-Si cell, only those electric charge carriers contribute to the efficiency of the cell which are produced directly in the space-charge zone, and the diffusion of charge carriers from regions outside the field zone being of secondary importance, a wide space-charge zone, as far as possible ranging over the entire thickness of the a-Si cell, i.e. about one micron, is desirable. Only then may charge carriers owing their existence to the longer waves of sunlight which penetrate deeper into the a-Si, also contribute to the efficiency of the cell. In the best prior art at a-Si cells, widths of about 0.2 microns of the field zone were estimated.

SUMMARY OF THE INVENTION

The present invention is directed to a method of producing amorphous silicon semiconductor elements having a substantially higher efficiency by providing conditions for a glow discharge resulting in a substantially higher ionization of the respective gas used. The invention is further directed to a device for carrying out the method.

In accordance with the invention, to precipitate amorphous silicon from silane or other suitable silicon compounds by means of a glow discharge, an additional magnetic field is provided in the deposition chamber or vessel which field extends transversely to the electric field and has such properties that the electrons from the gas discharge are conducted above the substrate along cyloids.

The invention makes it possible to obtain field zones of more than 0.5 microns in width and thus efficiencies of more than 6%. Further advantages of the invention are that the material can be deposited at lower temperatures and that higher electrical conductivities of the n-type or p-type doped a-si layers are obtained. In the discharge space, the electrons causing the gas ionization, are kept on paths close to the substrate surface by the magnetic field. This strongly increases the ionization of the gas, especially in the proximity of the substrate. What is strongly increased in the first place is the supply of atomic hydrogen, or, depending on the type of gas used, may be of halogens, whose incorporation into the a-Si is of particular importance for reducing the number localized states in the mobility gap of the a-Si.

Accordingly, an object of the present invention is to provide a method of manufacturing semiconductor elements of amorphous silicon which convert light into electrical energy comprising, supplying a silicon compound to a chamber, creating a glow discharge in the chamber to deposit amorphous silicon onto a substrate in the chamber, and providing a magnetic field in the chamber which is directed substantially transversely to the electric field and is of a magnitude to conduct the electrons above the substrate and along closed paths.

Another object of the present invention is to provide a device for manufacturing semiconductor elements of amorphous silicon which convert light into electrical energy comprising, a vessel, electrodes in the vessel for supporting at least one substrate for receiving deposited amorphous silicon thereon, electric power supply means connected to the electrodes for establishing an electric field in the vessel to deposit the amorphous silicon onto the substrate, gas inlet means connected to the vessel and gas outlet means connected to the vessel for supplying a silicon compound into and from the vessel, and magnetic field configuration associated with the vessel for producing a magnetic field in the vessel, in the vicinity of at least one of the electrodes for confining the free electrons into closed paths in the vicinity of the electrode carrying at least one substrate.

A further object of the invention is to provide a device which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

BRIEF DESCRIPTION OF THE DRAWINGS

In the drawings:

FIG. 1 is a schematic side sectional view of a deposition chamber or vessel for the glow discharge;

FIGS. 2 and 3 are top perspective views of two arrangements for producing the magnetic field.

DESCRIPTION OF THE PREFERRED EMBODIMENTS

Turning to the drawings in particular, the invention embodied therein comprises a device for manufacturing semiconductor elements of amorphous silicon which convert light into electrical energy comprising a chamber or vessel 1 for containing a silicon compound, electrodes 2 and 3, and electric power supply for producing an electric field in the vessel to form a glow discharge in the vessel and a magnetic configuration or means 10 for producing a magnetic field substantially transverse to the electrical field to confine the free electrons in closed paths about a surface of a substrate on which amorphous silicon is to be deposited.

The deposition chamber or vessel 1 for precipitating a-Si/H is made substantially of stainless steel. Electrodes 2 and 3 accommodated in the vessel are supplied from above and below and connected to the radio-frequency generator 4. Substrates 5 and 6, of stainless steel or glass for example, are supported by the electrodes.

The reaction gas, which may be a mixture of $SiH_4$ and $H_2$ or of other suitable gases, is directed from the left through a gas inlet 7 into vessel 1 and flows to the reaction space 8 formed by the volume between electrodes 2 and 3. The rest gases from the reaction are evacuated by a pump 9 through an outlet 11. The magnets 10, provided above electrode 2 in this embodiment, may also be disposed below electrode 3, or both above and below electrodes 2 and 3 (see FIGS. 2 and 3). The lines of magnetic force or flux lead from an annular pole plate 10b into reaction space 8 and therefrom to a circular pole plate 10a at the center of the arrangement. The magnetic field is symmetrical about the axis 12 and appears as a circular ring, as viewed from above. Pole plates 10a, 10b which are made of a magnetic material such as iron, are magnetized by U-shaped magnets 10 provided below. Four are used in the present example but only two are shown. In the embodiment according to FIG. 3, the arrangement is substantially extended. In this design, pole plates 10c and 10d are magnetized by a larger number of magnets and an extended magnetic ring of any length is formed. In this way, a desired magnetic field for much larger electrodes may be produced providing a large surface for receiving substrates. Magnetic fields of the kind shown in FIGS. 2 and 3 may, of course, also be produced by means of electromagnets. Still other configurations of magnetic fields are imaginable. In any case, however, it is important to produce a magnetic field directed transversely to the electric field between electrodes 2 and 3, over as extended a range as possible.

In both shown arrangements, upon setting the radio-frequency generator 4 in operation and directing the gas mixture through the vessel, electrons from the gas discharge are conducted by the combined effect of the electric and magnetic fields along cycloidal paths 14 above the surface of the substrates. As compared to a discharge without a magnetic field, the life time of electrons in reaction space 8 is considerably extended, with the result of the desired substantially increased gas ionization.

The electrons follow the cycloidal paths closed in themselves along the magnetic ring. The radius of the cyloids 15 determined by the intensities of the electric and magnetic fields E and H, and is chosen smaller than the spacing between electrodes 2 and 3 labeled 16, so that no electrons can be lost by impacts on the electrodes. Only with such a provision the electrons can repeatedly travel along the magnetic ring and the high gas ionization can permenently be maintained. Typical values of E and H are about 400 to 800 volt per centimeter, and about 100 to 300 gauss, respectively. Since the described arrangement is operated with an AC current of high frequency, for example 13.56 Mhz, E is determined by a mean value of the electric potential produced on electrode 2.

While specific embodiments of the invention have been shown and described in detail to illustrate the application of the principles of the invention, it will be understood that the invention may be embodied otherwise without departing from such principles.

What is claimed is:

1. A method of manufacturing semiconductor elements of amorphous silicon which convert light into electrical energy comprising:
   (a) providing a vessel defining a chamber;
   (b) supplying a silicon compound to the chamber;
   (c) providing two facing spaced apart electrodes in said chamber for supporting at least one substrate for receiving deposited amorphous silicon thereon, the substrate disposed between the electrodes;
   (d) passing an electric current which alternates in the RF range in the chamber and between the electrodes to produce an electric field of 400 to 800 volts per cm. and to produce a glow discharge with free electrons in the chamber to deposit amorphous silicon from the silicon compound on to the substrate;
   (e) providing a central pole plate and an outer annular surrounding pole plate forming a closed loop around said central pole plate, and providing at least one magnet having one pole connected to said central pole plate and an opposite pole connected to said outer surrounding pole plate, said pole plates positioned on a side of at least one of said electrodes away from the glow discharge in said chamber and said at least one magnet positioned on a side of said pole plates away from said at least one electrode;
   (f) the magnet providing a magnetic field of 100 to 300 gauss in the vessel which is directed substantially transversely to the electric field and is of a magnitude to conduct the electrons have the substrate along closed paths; and
   (g) the magnitude of the magnetic field provided being strong enough so that the closed paths of the electrons are in the form of cycloids with radii of the cycloids being smaller than the spacing between the electrodes.

2. A method according to claim 1, wherein the silicon compound comprises silane.

3. A method according claim 1, including supplying hydrogen gas to the chamber.

4. A method according to claim 1, wherein said magnet is U-shaped.

* * * * *